United States Patent
Morales (10) Patent No.: US 7,851,950 B1
(45) Date of Patent: Dec. 14, 2010

(54) POWER DISTRIBUTION SYSTEM FOR DATA CENTER

(75) Inventor: Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 204 days.

(21) Appl. No.: 12/165,131

(22) Filed: Jun. 30, 2008

(51) Int. Cl.
   *H01B 7/30* (2006.01)
(52) U.S. Cl. .................................................. 307/147
(58) Field of Classification Search ............... 307/147
   See application file for complete search history.

(56) References Cited

U.S. PATENT DOCUMENTS

| | | | |
|---|---|---|---|
| 4,060,735 A | * | 11/1977 | Pascucci et al. ............ 307/3 |
| 5,675,194 A | * | 10/1997 | Domigan ................. 307/147 |
| 6,992,247 B2 | | 1/2006 | Rasmussen et al. |
| 7,560,831 B2 | | 7/2009 | Whitted et al. |
| 2007/0046103 A1 | | 3/2007 | Belady et al. |

* cited by examiner

Primary Examiner—Robert L. DeBeradinis
(74) Attorney, Agent, or Firm—Robert C. Kowert; Meyertons, Hood, Kivlin Kowert & Goetzel, P.C.

(57) ABSTRACT

A power distribution system for computer systems in a computer room of a data center includes a first transformer and a second transformer. The first transformer transforms three-phase source power to three-phase intermediate power in a set of intermediate power lines. The intermediate power is transmitted in the set of intermediate power lines to a second transformer in or under the computer room. The second transformer transforms the three-phase intermediate power to operating power in a set of operating power lines at an operating phase-to-neutral voltage between about 220 volts and about 260 volts. The output of the second transformer is coupled to power distribution units in server racks in the computer room.

21 Claims, 6 Drawing Sheets

POWER DISTRIBUTION SYSTEM FOR DATA CENTER

BACKGROUND

1. Field of the Invention

The present invention relates generally to electrical power distribution and more particularly, to methods and apparatus for distributing electrical power to computer systems in computer facilities.

2. Description of the Related Art

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility. The number and length of conductors for required for a computer room can create substantial inefficiencies in power delivery to the components, specifically in the form of heat dissipated from the conductors. In addition, the amount of current any one wire can carry is limited by the size of the wire, insulation characteristics, and other factors.

SUMMARY

Various embodiments of power distribution system for computer systems in a computer room of a data center are disclosed. In an embodiment, a power distribution system includes a first transformer and a second transformer. The first transformer transforms three-phase source power to three-phase intermediate power. The second transformer has secondary windings in a Y configuration. The second transformer transforms the three-phase intermediate power to operating power at an operating phase-to-neutral voltage between about 220 volts and about 260 volts. Power distribution units coupled to the second transformer. Power distribution units are configured to supply operating power from the second transformer to one or more computer systems in the data center.

In an embodiment, a power distribution system for providing power to a computer room includes a first transformer and a second transformer. The first transformer transforms three-phase source power to three-phase intermediate power in a set of intermediate power lines. The intermediate power is transmitted in the set of intermediate power lines to a second transformer in or under the computer room. The second transformer transforms the three-phase intermediate power in the set of intermediate lines to operating power in a set of operating lines. The operating power lines include three phase legs and one neutral. The output of the second transformer is coupled to power distribution units in server racks in the computer room including power receptacles. Each power receptacle in the power distribution units supplies operating power from one of three phase legs of the operating power.

In an embodiment, a method of supplying power to computer systems in a computer room of a data center includes stepping down three-phase source power from a source power feed to three-phase intermediate power. The three-phase intermediate power is transmitted to a location in or under the computer room. In or under the computer room, the three-phase intermediate power is stepped down to a three-phase operating power having a phase-to-neutral voltage between about 220 volts and about 260 volts. The three-phase operating power to one or more power distribution units in the computer room. The power distribution units may be located in server racks in the computer room.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, "wye transformer" or "Y transformer" refers to a transformer whose secondary windings are in a wye, or Y, configuration.

As used herein, "delta transformer" refers to a transformer whose secondary windings are in a delta configuration.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

Figure 1:
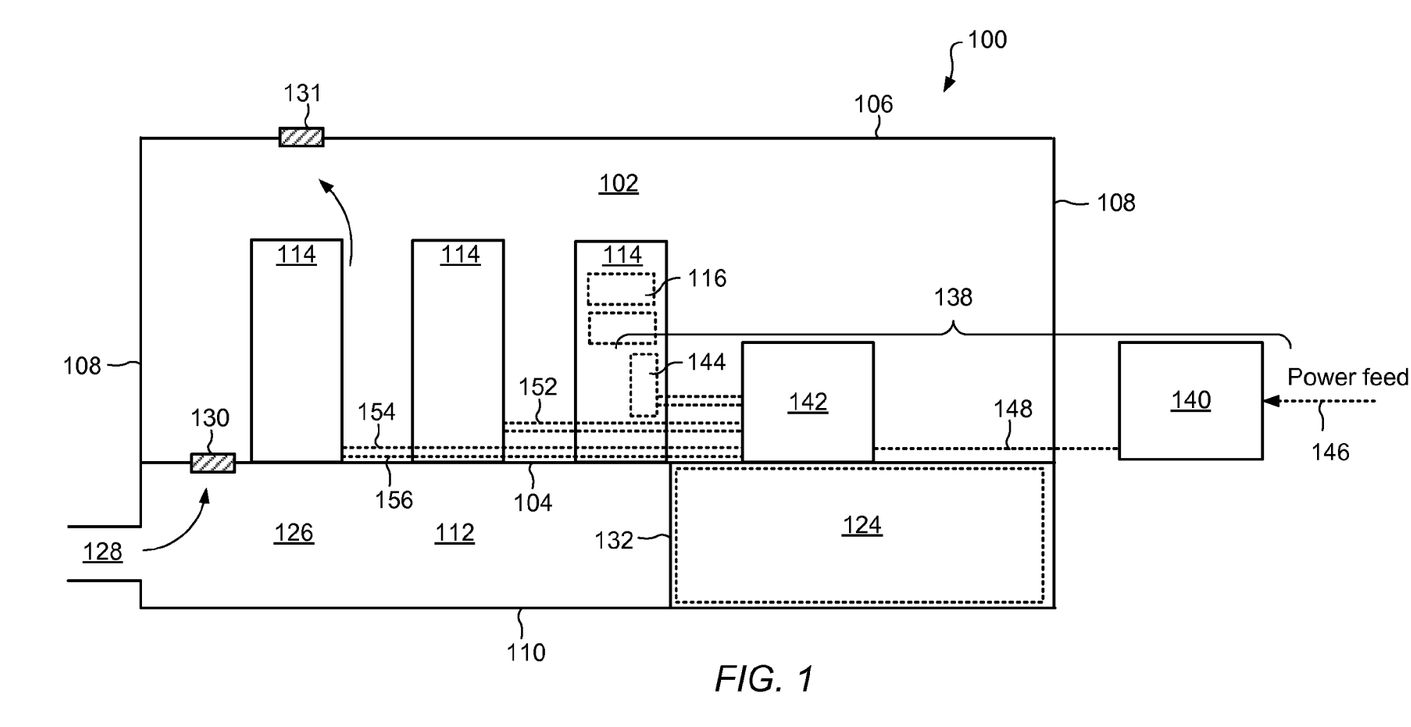
FIG. 1 is a schematic view illustrating one embodiment of a power distribution system with a step-down transformer in a computer room of a data center.

FIG. 1 is a schematic view illustrating one embodiment of a data center. Data center 100 includes computer room 102. Computer room 102 includes raised floor 104, ceiling 106, and walls 108. Raised floor 104 is elevated relative to lower floor 110. Lower space 112 is formed between raised floor 104 and lower floor 110.

Computer room 102 includes at least one equipment rack system, or rack 114. Racks 114 may be substantially similar to one another with the exception of a configuration of electronic components within each of the racks 114. Although three racks 114 are shown in FIG. 1, a computer room may have only one or two racks, or many racks. Racks 114 may house servers 116 and various other components.

Lower space 112 includes lower equipment space 124 and plenum space 126. Equipment space 124 may house various components including power distribution equipment, cabling, power buses, power terminals, data buses, data terminals, and spares. Plenum space 126 may receive cooling air from supply duct 128. Supply duct 128 may supply cooling air from an air handling system for the data center. Cooling air may be vented from plenum space 126 through floor vents 130 in raised floor 104. The cooling air may pass through and/or over racks 114 and exit computer room 102 through ceiling vents 131 in ceiling 106.

In FIG. 1, lower equipment space 124 and plenum space 126 are separated by wall 132. In other embodiments, there may be no physical barrier between equipment and the cooling air.

Racks 114 may be supplied with power from a source power feed to data center 100 through power distribution system 138. Power distribution system 138 includes first stage transformer 140, second stage transformer 142, and rack power distribution units 144.

First stage transformer 140 may be located outside of computer room 102. In certain embodiments, first transformer 140 may be in lower equipment space 124. First stage transformer 140 is coupled to source power feed through source power lines 146. In one embodiment, the source power feed is a three-phase feed having nominally 13.5 kilovolts on each phase. First stage transformer 140 may step-down the source power to a lower voltage. In one embodiment, first stage transformer 140 is a delta transformer (e.g., with both primary and secondary windings connected in a delta configuration).

Second stage transformer 142 is located in computer room 102. Second stage transformer 142 is coupled to first stage transformer 140 by way of intermediate power lines 148. In an embodiment, each of intermediate power lines 148 includes one or more 8-gauge insulated wires. Intermediate power lines may include one or more hot lines. In certain embodiments, intermediate power lines may include one or more neutral lines and one or more ground lines. In certain embodiments, intermediate power may include neither a ground line nor a neutral line. Intermediate power lines 148 may be routed between first stage transformer 140 and second stage transformer 142 on, under, or above floor 104 of computer room 102.

Rack power distribution units 144 are coupled to second stage transformer 146 by way of operating power lines 152. In one embodiment, each of operating power lines 148 includes one or more 8-gauge insulated wires. Operating power lines 152 hot lines 154, neutral lines 156 and a ground line. In other embodiments, however, operating power lines 152 may include neither a ground line and or neutral line. In some embodiments, ground from racks 114 may be provided by a direct or indirect connection to the structure of the building. This ground may be in addition to, or instead of, a ground line through first stage transformer 140 or second stage transformer 142. Operating power lines 152 may be routed between second stage transformer 142 and racks 114 in conductors running through, under, or above computer room 102, or a combination thereof. Operating power lines 152 may include insulated wires, buses, electrical connectors, electrical terminals, or combinations thereof.

Although in the embodiment illustrated in FIG. 1 there are two stages of transformers between source power feed 146 and racks 114 in the computer room, in other embodiments, there may be only one stage of transformer, or three or more stages of transformers between the source power feed and rack systems in a computer room.

Figure 2:
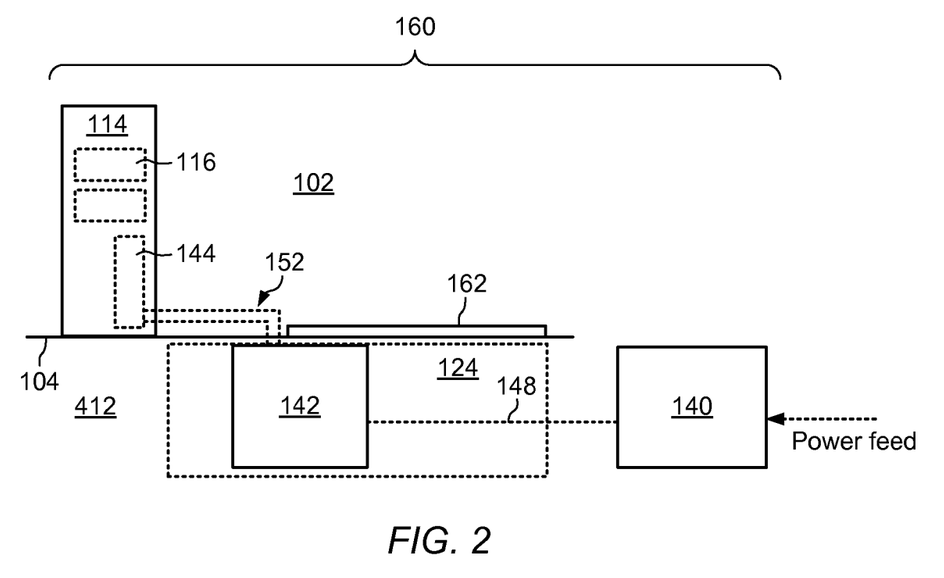
FIG. 2 is a schematic view illustrating one embodiment of a power distribution system with a step down transformer under a computer room of a data center.

FIG. 2 illustrates an alternate embodiment of a power distribution system in a data center. Power distribution system 160 includes second stage transformer 142 is located in lower equipment space 124 below raised floor 104. Raised floor 104 includes access panel 160. Access panel 162 may be opened or removed as needed for maintenance of second stage transformer 142 and other equipment in lower equipment space 124. Other portions of power distribution system 160 may be similar to those shown in FIG. 1.

Figure 3:
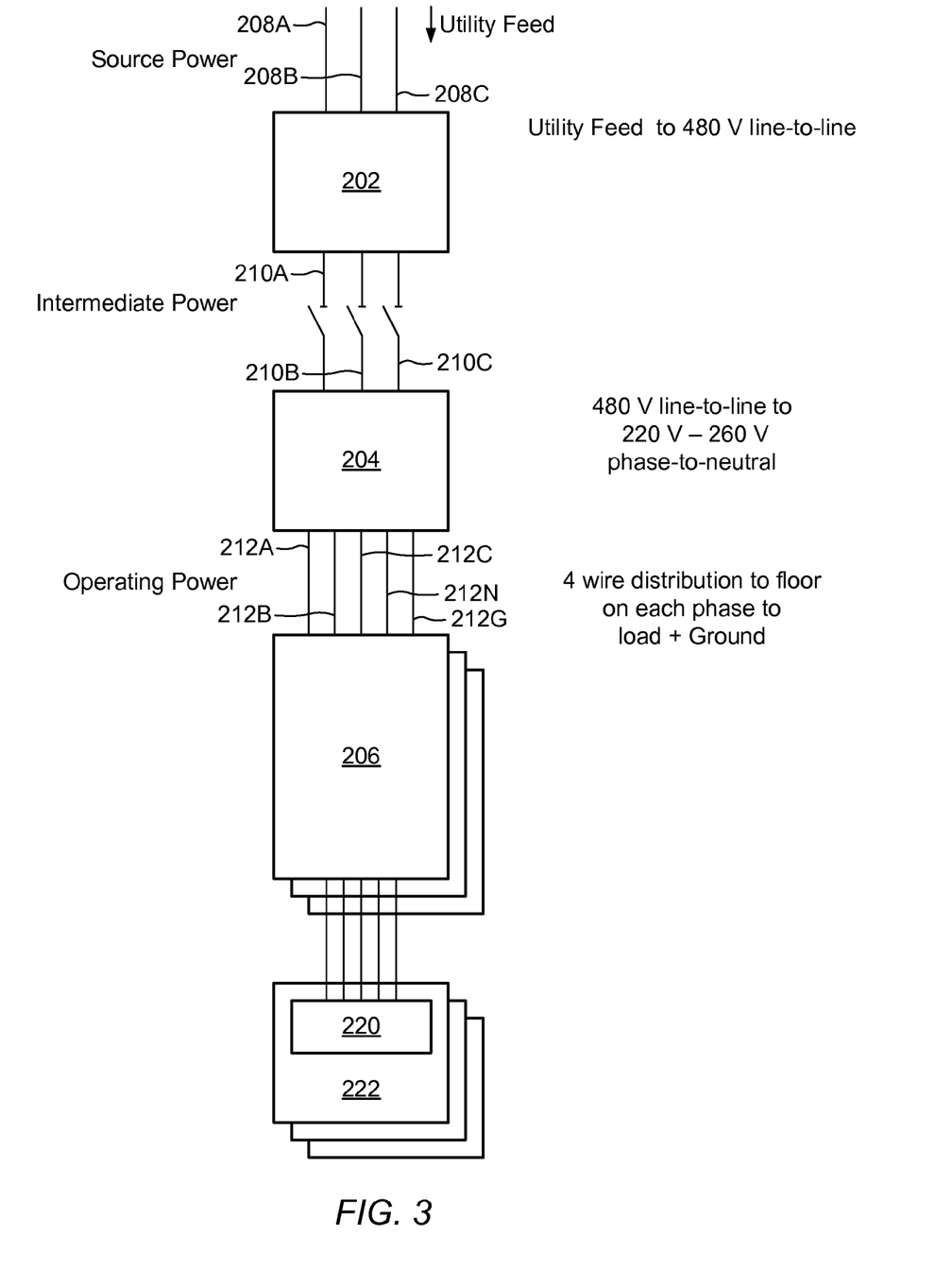
FIG. 3 is a schematic diagram illustrating an embodiment of a power distribution system for a data center including two step-down transformers for supplying rack power distribution units.

FIG. 3 is a schematic illustrating one embodiment of a power distribution system. Power distribution system 200 includes transformers 202 and 204 and rack power distribution units 206. Transformer 202 is coupled to a utility feed. The Utility feed may be a medium voltage feed. In certain embodiments, the utility feed is at a voltage of about 13.5 kilovolts or 12.8 kilovolts at a frequency of about 60 Hz. In one embodiment, source power lines 208A, 208B, and 208C are aluminum conductors.

In one embodiment, transformer 202 steps down voltages from the three-phase utility feed to intermediate power at intermediate line-to-line voltages of about 480 V. In some embodiments, transformer 202 may be implemented as a series of two or more transformers that step down the voltage incrementally. For example, one transformer may step down a feed voltage at 60+ kilovolts to a voltage between 5 kilovolts and 10 kilovolts. A second transformer may further step down from line-to-line voltages of between 5 kilovolts and 10 kilovolts to line-to-line voltages at about 480 volts. Intermediate power may be transmitted via intermediate power lines 210A, 210B, and 210C. In an alternate embodiment, the voltage of the intermediate power is between about 380 volts and about 420 volts.

Transformer 204 may step three-phase intermediate power from transformer 202 down to operating power (e.g. "floor" power). The operating power may be at a line-to-neutral voltage of between about 220 volts and about 260 volts. Transformer 204 may be a wye transformer. In one embodiment, transformer 204 has primary windings in a delta configuration and secondary windings in a wye configuration.

The output from transformer 204 is transmitted via one or more sets of phase lines 212A, 212B, and 212C, and neutral line 212N to one or more power distribution units 206. Each of phase lines 212A, 212B, and 212C may carry up to about 42 amps. The total output for each power distribution unit 206 may be about 17 kVA. Transformer 204 also includes ground line 212G. Computer system components may also be grounded to the floor structure of the computer room (either by conductors or through the structure of the rack in which they are enclosed). In certain embodiments, ground line 212G is omitted.

In one embodiment, transformer 204 steps the intermediate power at line-to-line voltages of about 480 volts down to operating power at phase-to-phase voltages between about 380 volts and about 450 volts and phase-to-neutral voltages between about 220 volts and about 260 volts. The limits in the ranges described above may be within typical manufacturing tolerances for transformers in power distribution applications and may be dependent on the particular transformer winding configuration and materials. Lines 212A, 212B, and 212C, and neutral line 212N may transmit operating power to one or more power distribution units 206.

In another embodiment, transformer 204 steps the intermediate power at line-to-line voltages of about 480 volts down to operating power at phase-to-phase voltages between about 380 volts and about 420 volts and phase-to-neutral voltages between about 222 volts and about 242 volts. The nominal phase-to-neutral voltages of the operating power lines may be, for example, about 232 volts +/−10 volts. Lines 212A, 212B, and 212C, and neutral line 212N may transmit operating power to one or more power distribution units 206.

Power distribution units 206 are coupled to one or more server power supplies 220 in servers 222. Various of servers 222 in a system may operate on different phases of power distribution system 200. In some embodiments, server power supplies 220 are configured to receive power at variable input voltages. In one embodiment, server power supplies 220 can accept input voltages up to 260 V. In another embodiment, server power supplies 220 can accept input voltages up to 240 V. In certain embodiments, transformers for a power distribution system are selected such that operating power to variable server power supplies is near the maximum input voltage specification for the server power supplies.

In one embodiment, the phase-to-phase output voltage of transformer 204 is about 416 V or less and the phase-to-neutral output voltage of transformer 204 is about 240 V or less.

Figure 4:
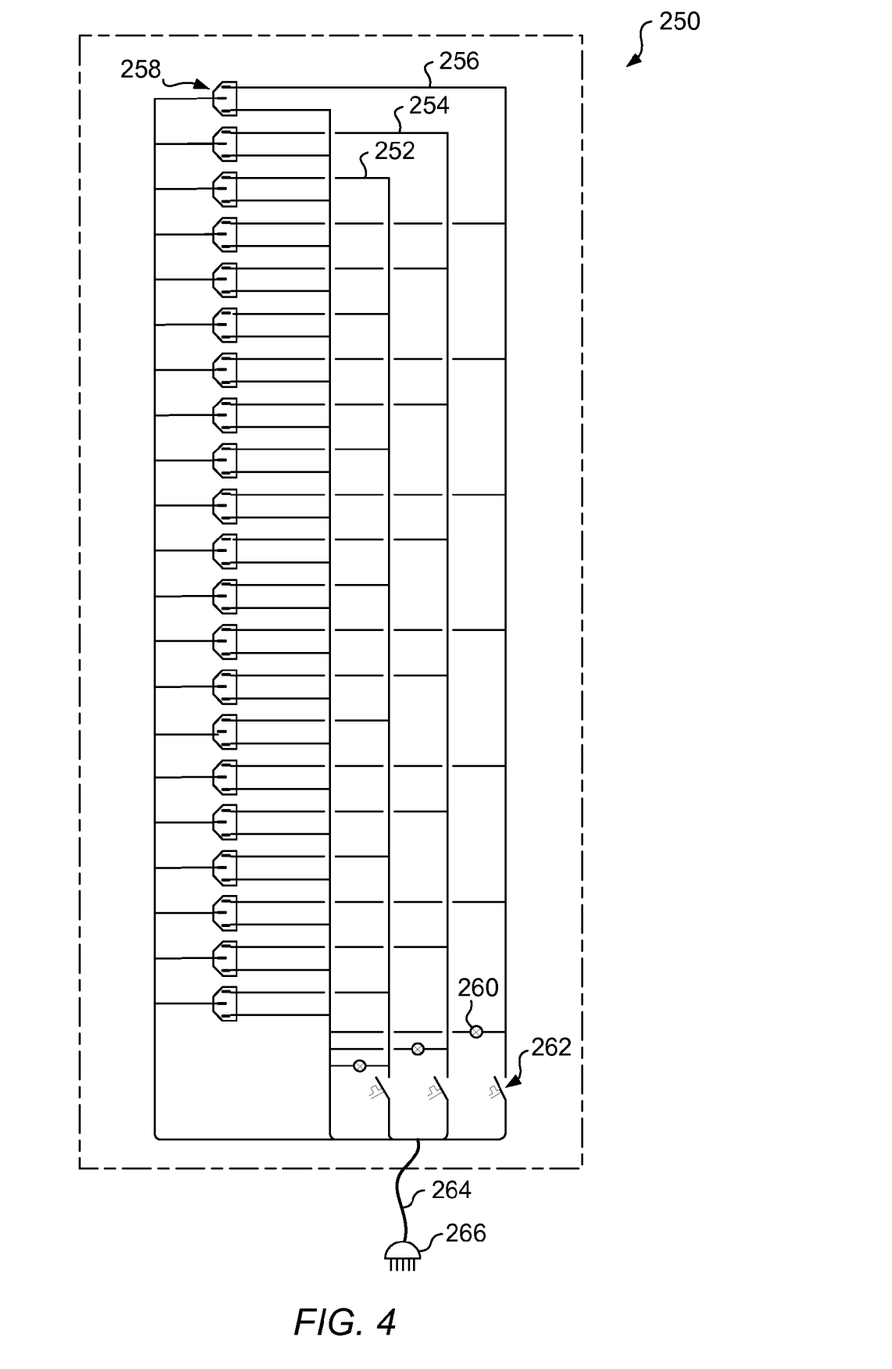
FIG. 4 illustrates a schematic diagram illustrating one embodiment of a power distribution unit.

FIG. 4 illustrates a schematic diagram illustrating one embodiment of a power distribution unit. Power distribution unit 250 includes legs 252, 254, and 256. Each of legs 252, 254, 256 may correspond to one phase of the input power. In one embodiment, each leg operates at a voltage between about 220 volts to about 260 volts.

Legs 252, 254, and 256 of power distribution unit 250 include wiring to receptacles 258. Many receptacles may be provided for each of legs 252, 254, and 256. In one embodiment, seven receptacles are provided for each of legs 252, 254, and 256. The legs of a power distribution unit may, however, include any number of receptacles. Each of legs 252, 254, and 256 include indicator light 260 and breaker 262. In one embodiment, breaker 262 is a 30A/32A single pole MCB. Breakers 262 may be located such that they can be accessed when server racks are in-line (e.g., at the top of power distribution unit 250).

Power for legs 252, 254, and 256 may be provided through by way of cable 264 and power connector 266. In one embodiment, cable 264 is an 8AWG/6 mm$^2$ 5 core cable and power connector 266 includes a 30A NEMA/32A IEC309 3Ph+N+E Plug. Cable 264 may be located at the bottom of power distribution unit 250.

Figure 5:
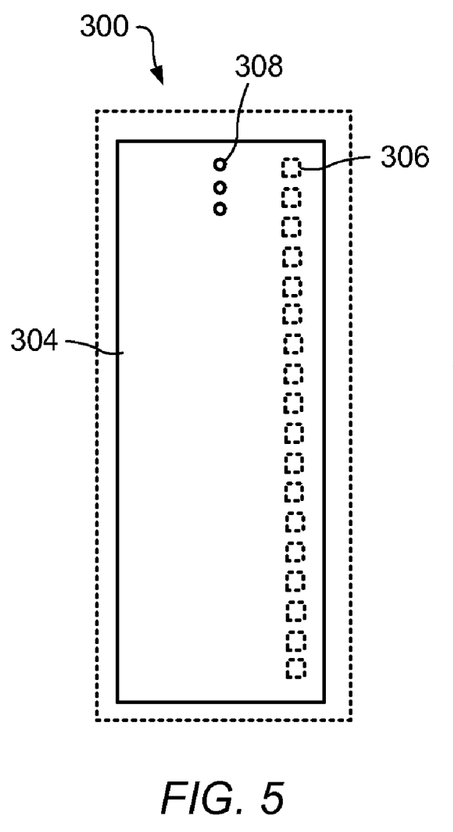
FIG. 5 is a back view illustrating one embodiment of a rack system including power distribution unit.
Figure 6:
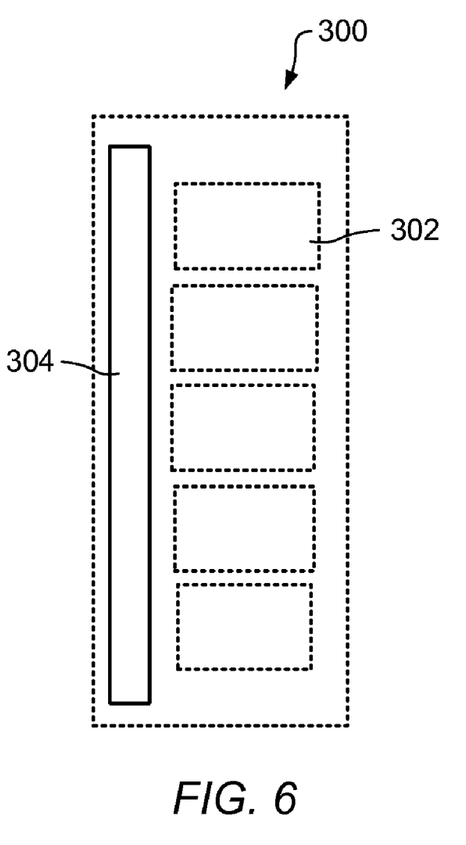
FIG. 6 is a side view illustrating one embodiment of a rack system including a power distribution unit.
Figure 7:
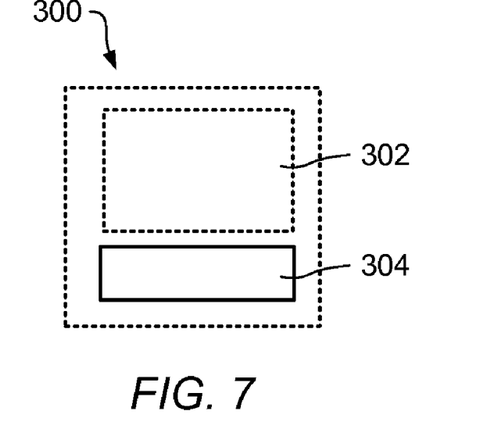
FIG. 7 is a top view illustrating one embodiment of a rack system including a power distribution unit.

FIG. 5 is a schematic front view illustrating one embodiment of a rack system including a power distribution unit. FIG. 6 is a schematic side view illustrating the rack shown in FIG. 5. FIG. 7 is a schematic top view illustrating the rack shown in FIG. 5. Rack system 300 includes servers 302 and power distribution unit 304. Servers 302 may be mounted in rack slots on rails at the front rack system 300. Power distribution may be mounted at the of rack system 300. In the embodiment shown in FIG. 5, power distribution unit 304 is shown as being the full height and full width of the space in rack system 300 (e.g., 36U). In other embodiments, however, a power distribution unit may be only part of the width of rack and/or only a part of the height of the space in the rack. Power distribution unit 304 includes receptacles 306 and indicator lights 308.

Figure 8:
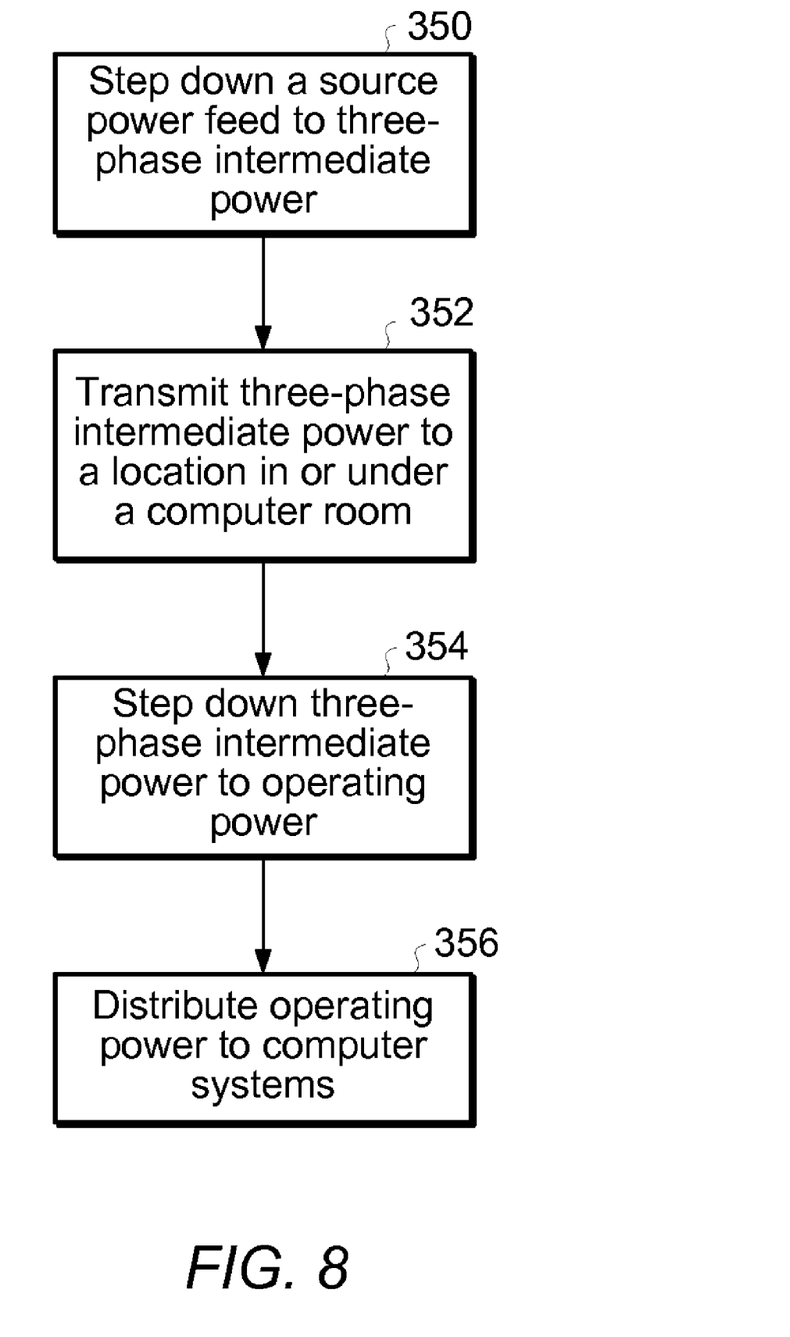
FIG. 8 illustrates supplying power to rack systems in a computer room.

FIG. 8 illustrates supplying power to rack systems in a computer room. At 350, a source power feed is stepped down to three phase intermediate power. At 352, three-phase intermediate power is transmitted to a location in or under a computer room of a data center. In one embodiment, the three-phase intermediate power is at a line-to-line voltage of about 480 V. At 354, the three-phase intermediate power is stepped down to operating power. In one embodiment, the operating power is at a phase-to-line voltage between about 220 volts and about 260 volts. At 356, the operating power is distributed to computer systems (e.g., servers) in the computer room.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A power distribution system for computer systems in a computer room of a data center, comprising:
    a first transformer configured to transform three-phase source power to three-phase intermediate power;
    a second transformer having secondary windings in a Y configuration, the second transformer configured to transform the three-phase intermediate power to three-phase operating power at operating phase-to-neutral voltages between about 220 volts and about 260 volts;
    wherein the first transformer is configured to step down the three-phase source power to intermediate phase-to-neutral voltages that are lower than the phase-to-neutral voltages of the three-phase source power but higher than the phase-to-neutral voltages of the three-phase operating power, wherein the second transformer is configured to step down the three-phase intermediate power to operating phase-to-neutral voltages that are lower than the intermediate phase-to-neutral voltages; and one or more power distribution units coupled to the second transformer, wherein at least one of the power distribution units is configured to supply operating power from the second transformer to a plurality of computer systems in the data center.

2. The power distribution system of claim 1, wherein the secondary windings of the first transformer are in a delta configuration.

3. The power distribution system of claim 1, wherein the an intermediate line-to-line voltage of the three-phase intermediate power is about 480 volts.

4. The power distribution system of claim 1, wherein the line-to-neutral voltage of the operating power is about 240 volts or less.

5. The power distribution system of claim 1, wherein second transformer is in the computer room of the data center, wherein the second transformer is configured to supply the operating power to computer systems in the computer room of the data center.

6. The power distribution system of claim 1, wherein second transformer is under a floor of the computer room of the data center, wherein the second transformer is configured to supply the operating power to computer systems in the computer room.

7. The power distribution system of claim 1, wherein at least one of the power distribution units comprises three arrays of power receptacles, wherein each of the arrays is on a separate leg of the operating power.

8. The power distribution system of claim 1, wherein at least one of the power distribution units is located in a rack in the computer room.

9. The power distribution system of claim 8, wherein at least one of the power distribution units is located at or proximate to the back of the rack.

10. The power distribution system of claim 1, at least one of the power distribution units further comprising a circuit breaker on at least one line of the operating power.

11. The power distribution system of claim 1, further comprising one or more power supplies configured to receive power from at least one of the power distribution units and supply power to at least one of the computer systems in the data center, wherein at least one of the power supplies is configured to receive power at variable input voltages.

12. The power distribution system of claim 1, further comprising one or more power supplies configured to receive power from at least one of the power distribution units and supply power to at least one of the computer systems in the data center, wherein at least one of the power supplies is configured to receive power at variable input voltages up to about 260 volts.

13. A power distribution system for providing power to a computer room of a data center, comprising:

a first transformer coupled to a three-phase source power, the first transformer being configured to a transform the three-phase source power to three-phase intermediate power in a set of intermediate power lines;

a second transformer in or under the computer room, the second transformer being configured to transform three-phase intermediate power in the set of intermediate lines to three-phase operating power in a set of operating lines, and wherein the first transformer is configured to step down the three-phase source power to intermediate phase-to-neutral voltages that are lower than the phase-to-neutral voltages of the three-phase source power but higher than the phase-to-neutral voltages of the three-phase operating power, wherein the second transformer is configured to step down the three-phase intermediate power to operating phase-to-neutral voltages that are lower than the intermediate phase-to-neutral voltages.

14. The power distribution system of claim 13, wherein the second transformer is located in the computer room.

15. The power distribution system of claim 13, wherein the second transformer is located under a floor of the computer room.

16. The power distribution system of claim 13, wherein the secondary windings of the second transformer are in a Y configuration.

17. The power distribution system of claim 13, wherein the secondary windings of the first transformer are in a delta configuration.

18. The power distribution system of claim 13, wherein the intermediate lines are at a line-to-line voltage of about 480 volts, wherein the operating lines are at a phase-to-neutral voltage between about 220 volts and about 260 volts.

19. A method of supplying power to computer systems in a computer room of a data center, comprising:

stepping down three-phase source power from a source power feed to three-phase intermediate power at intermediate phase-to-neutral voltages that are lower than the phase-to-neutral voltages of the three-phase source power;

transmitting the three-phase intermediate power to a location in or under the computer room;

stepping down the three-phase intermediate power to a three-phase operating power at operating phase-to-neutral voltages that are lower than the intermediate phase-to-neutral voltages, wherein the operating phase-to-neutral voltages are between about 220 volts and about 260 volts; and transmitting the three-phase operating power to one or more power distribution units in the computer room.

20. The method of claim 19, wherein the source power feed has a line-to-line voltage of about 13.5 kilovolts.

21. The method of claim 19, wherein the intermediate power has a line-to-line voltage of about 480 volts, wherein the three-phase source power is stepped down to the three-phase intermediate power with a transformer having secondary windings in a delta configuration, wherein the three-phase intermediate power is stepped down to the three-phase operating power with a transformer having secondary winding in a Y configuration.

* * * * *